United States Patent
Sim et al.

(10) Patent No.: US 8,963,617 B1
(45) Date of Patent: Feb. 24, 2015

(54) SWITCHING TOPOLOGY FOR CONNECTING TWO NODES IN ELECTRONIC SYSTEM

(71) Applicant: Linear Technology Corporation, Milpitas, CA (US)

(72) Inventors: Kok Yong Sim, Singapore (SG); David McLean Dwelley, Santa Barbara, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/033,110

(22) Filed: Sep. 20, 2013

(51) Int. Cl.
*H03K 17/687* (2006.01)
*H03K 3/012* (2006.01)
*H03K 17/74* (2006.01)

(52) U.S. Cl.
CPC .............. *H03K 3/012* (2013.01); *H03K 17/687* (2013.01); *H03K 17/74* (2013.01)
USPC ........................................................ 327/427

(58) Field of Classification Search
USPC .......... 327/427, 434, 538, 540, 541, 542, 543
See application file for complete search history.

(56) References Cited

U.S. PATENT DOCUMENTS

| | | | |
|---|---|---|---|
| 5,162,982 A | 11/1992 | Mentler | |
| 5,406,151 A * | 4/1995 | Kusunoki | 327/427 |
| 6,809,503 B1 | 10/2004 | Eagar | |
| 8,645,753 B2 * | 2/2014 | Yang et al. | 714/14 |
| 2010/0201333 A1 | 8/2010 | Sato | |

FOREIGN PATENT DOCUMENTS

JP  06-036384 A  2/1994

OTHER PUBLICATIONS

International Search Report dated Nov. 10, 2014 issued in International Patent Application No. PCT/US2014/051530.

* cited by examiner

*Primary Examiner* — Jeffrey Zweizig
(74) *Attorney, Agent, or Firm* — McDermott Will & Emery LLP

(57) ABSTRACT

A circuit for providing connection between a first node at a first voltage and a second node at a second voltage. The circuit has a first inductive element having a first terminal coupled to the first node, a first switching element coupled between a second terminal of the first inductive element and the second node, a second inductive element having a first terminal configured for receiving current from the second terminal of the first inductive element, and having a second terminal coupled to a third node, and a second switching element coupled between the first terminal of the second inductive element and the second node. The first and second switching elements are configured for providing alternating current flow paths between the first node and the second node.

19 Claims, 5 Drawing Sheets

SWITCHING TOPOLOGY FOR CONNECTING TWO NODES IN ELECTRONIC SYSTEM

TECHNICAL FIELD

This disclosure relates to electronic systems, and more particularly, to a switching circuit for providing connection between two nodes with different voltages.

BACKGROUND ART

Circuits used to provide connection between two nodes with different voltages include regulators which transfer power between the nodes in a controlled manner, hotswap circuits which join the two nodes together when the initial voltages are different, and surge suppression circuits which can protect one node from voltage surges on the other node. The two nodes typically have significant capacitance in any real circuit, which can cause very large currents to flow rapidly if the nodes are abruptly connected together. It takes some care to ensure that large transient voltage disturbances do not occur on the two nodes at the time when they are connected.

Circuits that provide connection between nodes often use dissipative elements. This typically requires a large switch device and a sophisticated controller that adjusts timing and slew rate to keep switch power dissipation within safe limits. This method maintains continuous current conduction at both the input and the output nodes during the connection event, which minimizes voltage disturbance at each node and devices that may be connected to these nodes. However, during the connection interval, significant power must be dissipated across the switch device. This causes the temperature of the switch device, such as a power transistor that may include a heat sink, to rise significantly during the connection event. The switching device must have an appropriate size to handle this temperature rise. At higher power levels, it may be difficult to find transistor devices that will work reliably.

Alternatively, a connection circuit may use a conventional buck regulator switching topology that limits current flow to safe levels by adjusting the duty cycle of the switching. This reduces power losses during the connection interval but causes the current at the input node to be discontinuous, which can disrupt or damage connectors and circuitry coupled to that node.

Therefore, there is a need for a new connection topology capable of minimizing power dissipation and providing continuous current conduction.

SUMMARY OF THE DISCLOSURE

In accordance with one aspect, the present disclosure offers a circuit for providing connection between a first node at a first voltage and a second node at a second voltage. The circuit has a first inductive element having a first terminal coupled to the first node, a first switching element coupled between a second terminal of the first inductive element and the second node, a second inductive element having a first terminal configured for receiving current from the second terminal of the first inductive element, and having a second terminal coupled to a third node, and a second switching element coupled between the first terminal of the second inductive element and the second node. The third node may be ground. The first switching element is configured for providing a first path for a current flow between the first node and the second node when the first switching element is turned on, and the second switching element is turned off. The second switching element is configured for providing a second path for a current flow between the first node and the second node when the second switching element is turned on and the first switching element is turned off.

Also, a capacitive element may be coupled between the second terminal of the first inductive element and the first terminal of the second inductive element.

The circuit may further comprise a controller configured for controlling a duty cycle of the first switching element or both the switching elements.

For example, one of the switching elements may be a transistor, and the other switching element may be a diode configured to conduct current when the first switching element is turned off. Alternatively, both switching elements may be transistors.

In one embodiment, the first and second inductive elements may be magnetically uncoupled. In another embodiment, the first and second inductive elements may be magnetically coupled. The first and second inductive elements may be of the same value, or may have different values.

The circuit may further comprise a current sense resistor configured to determine the sum of currents flowing through the first and second inductive elements.

In accordance with one aspect of the disclosure, the controller may be configured to control switching of the first switching element to provide a voltage at the second node regulated with respect to a voltage at the first node. For example, a voltage at the second node may be provided at a desired level lower than the voltage at the first node.

In one embodiment, the circuit may be configured as a voltage mode switching regulator having a feedback loop for providing a controller with a value representing voltage at the second node.

In another embodiment, the circuit may be configured as a current mode switching regulator having a feedback loop for providing a controller with a value representing voltage at the second node, and a current sense resistor for enabling the controller to determine current at the second node.

In a further embodiment, the controller may be configured to operate in a fixed frequency mode.

In another embodiment, the controller may be configured to operate in a hysteretic mode.

Further, the circuit may be configured as a hot swap circuit for attaching a load to the second node to receive a voltage from the first node.

Also, the circuit may be configured as an overvoltage protection circuit for protecting a load coupled to the second node from voltage spikes at the first node.

In accordance with a method of the present disclosure, the following steps may be carried out to provide connection between a first node at a first voltage and a second node at a second voltage:
  coupling a first inductive element, a capacitive element and a second inductive element in a series between the first node and a third node, where the third node may be ground,
  coupling a first switching element between the second node and a node connecting the first inductive element and the capacitive element,
  coupling a second switching element between the second node and a node connecting the second inductive element and the capacitive element, and
  switching the first switching element and the second switching element to provide alternating first and second current flows through the first and second switching elements.

The second switching element may be turned off, when the first switching element is turned on, and the second switching element may be turned on, when the first switching element is turned off.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using specific examples of a switching topology for connecting two nodes with different voltages. However, one skilled in the art would realize that the concept of the disclosure is applicable to various other modifications of connection circuitry.

Figure 1A:
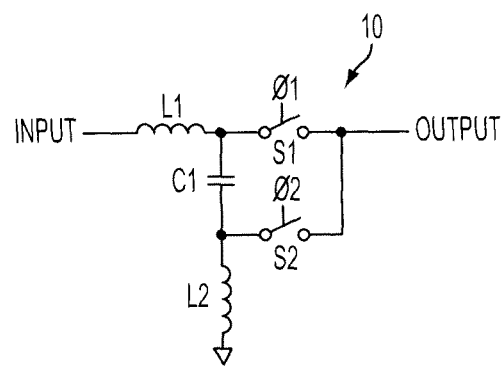
FIGS. 1A-1C illustrate an exemplary switching topology for connecting two nodes in accordance with the present disclosure.

FIG. 1A shows an exemplary switching circuit 10 for providing connection between an input node "INPUT" and an output node "OUTPUT" in an electronic system. An output voltage at the output node may be different from an input voltage applied to the input node. The circuit 10 includes an inductive element L1, a capacitive element C1 and an inductive element L2 connected in series between the input node and a voltage supply node that provides a voltage at a level less than the output voltage. As shown in FIG. 1A, the voltage supply node may be a ground node.

A main path switching element S1 is coupled between the output node and a node connecting the inductive element L1 and the capacitive element C1. An auxiliary path switching element S2 is coupled between the output node and a node connecting the inductive element L2 and the capacitive element C1.

Figure 1B:
Figure 1C:
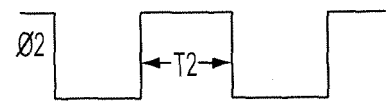

FIGS. 1B and 1C are timing diagrams illustrating control signals 01 and 02 provided to control the switching elements S1 and S2, respectively. During time interval T1, the switching element S1 is turned on, providing a main path for a current flow between the input node and the output node. During time interval T2, the switching element S2 is turned on, providing an auxiliary path for a current flow between the input node and the output node. When the switching element S1 is turned on, the switching element S2 is turned off, and when the switching element S2 is turned on, the switching element S1 is turned off.

The inductive elements L1 and L2 may be independent, i.e. magnetically uncoupled. Alternatively, the inductive elements L1 and L2 may share a common core, i.e. they may be magnetically coupled. Continuous current conduction is provided between the input and output nodes as long as the capacitive element C1 connecting L1 and L2 is present. The capacitive element C1 may be optionally removed from the circuit 10 if the inductive elements L1 and L2 are magnetically coupled. However, in this case, the current between the input and the output nodes is not continuous.

Figure 2:
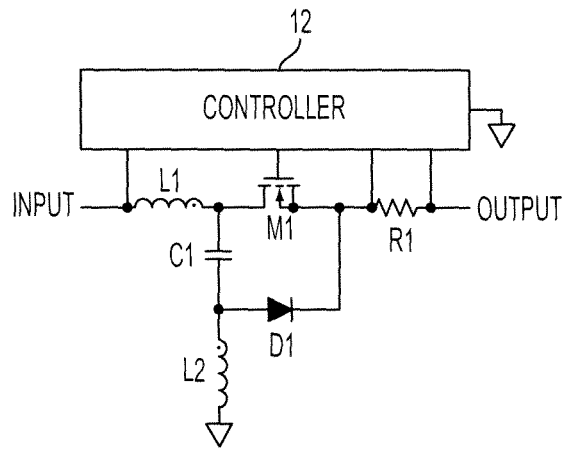
FIG. 2 illustrates an exemplary implementation of the topology in FIG. 1, FIGS. 3A-3E are timing diagrams illustrating current in the circuit in FIG. 2.
Figure 3A:
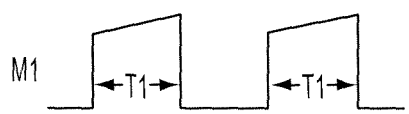
Figure 3B:
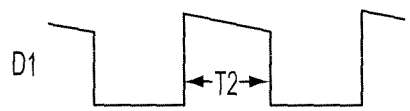
Figure 3C:
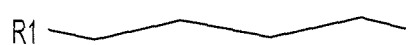
Figure 3D:
Figure 3E:
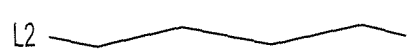

An exemplary implementation of the switching circuit 10 is illustrated in FIG. 2. For example, a MOSFET M1 may be used as the switch S1, and a diode D1 may be used as the switch S2. The switches S1 and S2 may be implemented by MOSFET, IGBT or bipolar transistors, or by diodes. A current sense resistor R1 may be provided between the output node and the switches for monitoring the output current. A controller 12 may determine the current flowing via the resistor R1 to control switching of the MOSFET M1.

FIGS. 3A-3E illustrate the current respectively flowing through the MOSFET M1, the diode D1, the sense resistor R1, the inductive element L1 and the inductive element L2. During time interval T1 determined by the controller 12, the MOSFET M1 is turned on by the controller 12, and the current through M1 builds up to a predetermined peak current threshold value set by the controller 12.

The controller 12 switches M1 off during time interval T2 and the current flows through the alternate current path provided by the diode D1. At the expiration of the controller timed interval T2 or when the current sensed by the sense resistor R1 reduces to a predetermined threshold, the controller 12 turns M1 back on. The switching of M1 is repeated until the controller 12 determines that the input and output voltages are equal. The currents at the input, output, and ground nodes all flow in a continuous manner, and the sum of the currents through L1 and L2 equals to the output current flowing in R1.

The voltage difference between the input and output nodes during time interval T1 appears across the inductive element L1. The excess energy is absorbed by the reactive elements L1, C1 and L2 when the switch M1 is on. During the next time interval T2, the reactive elements L1, C1 and L2 return the stored energy to the output node and maintain the continuous input current flow. The controller 12 alternates the current flow between the main and auxiliary current paths while maintaining continuous current conduction at both input and output nodes.

As discussed in more detail below, the circuit 10 may provide switching regulation between the input and output nodes using current or voltage mode feedback. The controller 12 may use various switch controlling schemes, including hysteretic mode, fixed frequency mode, constant on/off times, or any other schemes for controlling switches S1 and S2 so as to bring the input and output voltages to equal values.

Figure 4:
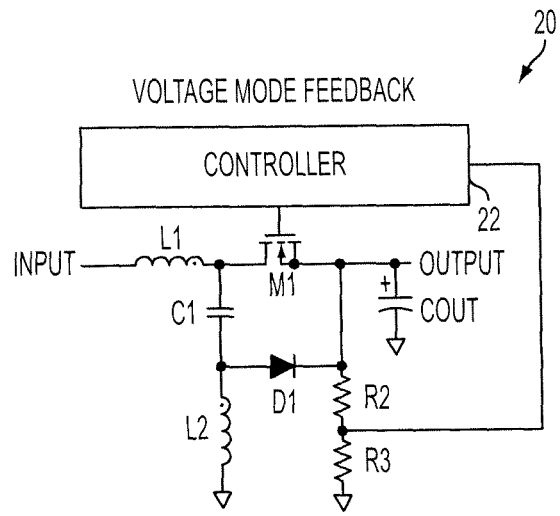
FIG. 4 illustrates an exemplary voltage mode switching regulator with the topology of the present disclosure.

For example, FIG. 4 illustrates an exemplary switching regulator 20 with a voltage mode feedback. A voltage divider composed of resistors R2 and R3 is coupled to the output node to determine the output voltage at a node between R2 and R3. The output capacitor Cout is also coupled to the output node. The controller 22 may control switching of MOSFET M1 based on the output voltage to alternate the current flow between the main and auxiliary paths until the output voltage is equal to a predetermined value.

Figure 5:
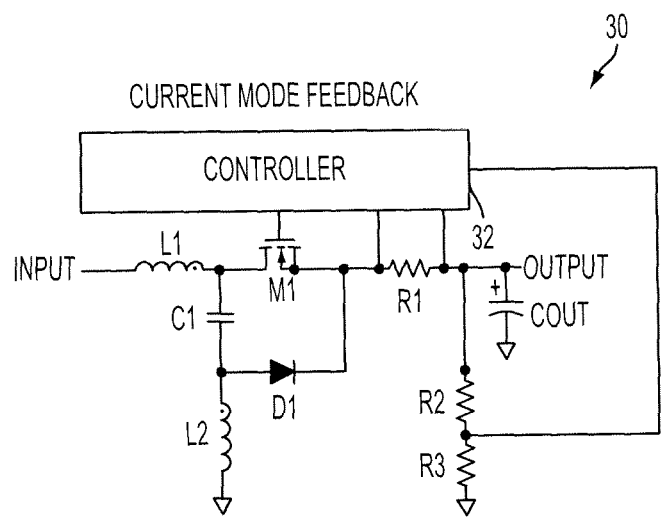
FIG. 5 illustrates an exemplary current mode switching regulator with the topology of the present disclosure.

FIG. 5 illustrates an exemplary switching regulator 30 with a current mode feedback. A controller 32 may control switching of MOSFET M1 based on the output current sensed by the sense resistor R1 to alternate the current flow between the main and auxiliary paths until the output voltage at the node between R2 and R3 is equal to a predetermined value.

Figure 6:
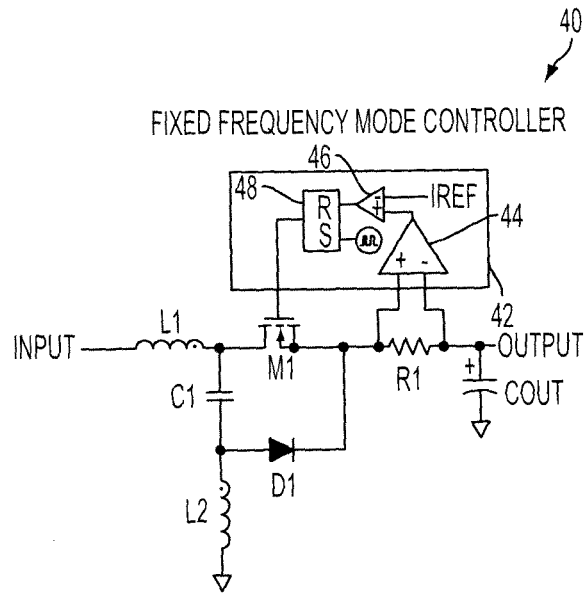
FIG. 6 illustrates an exemplary fixed frequency mode switching regulator with the topology of the present disclosure.

FIG. 6 illustrates an exemplary switching regulator 40 with a controller 42 operating in a fixed frequency mode. The controller 42 includes operational amplifier 44 that monitors a voltage drop across the sense resistor R1. This voltage drop represents the current flowing through the resistor R1. A comparator 46 compares the output signal of the operational amplifier 44 with a signal representing a reference current value Iref. An RS latch 48 has a set input S supplied with a fixed frequency clock signal that may be produced by an oscillator, and a reset input R supplied with the output signal of the comparator. The switch M1 is controlled by the output signal of the RS latch 48.

When the latch 48 is set at the beginning of each clock period of the clock signal, the output of the RS latch 48 goes high turning on the switch M1 and providing a current flow via the main current path. When the current sensed by the resistor R1 reduces to the Iref value, the output of the latch 48 goes low turning off the switch M1 and providing a current flow via the auxiliary current path provided by the diode D1. The switching of M1 continues until the output voltage is at a desired level.

Figure 7:
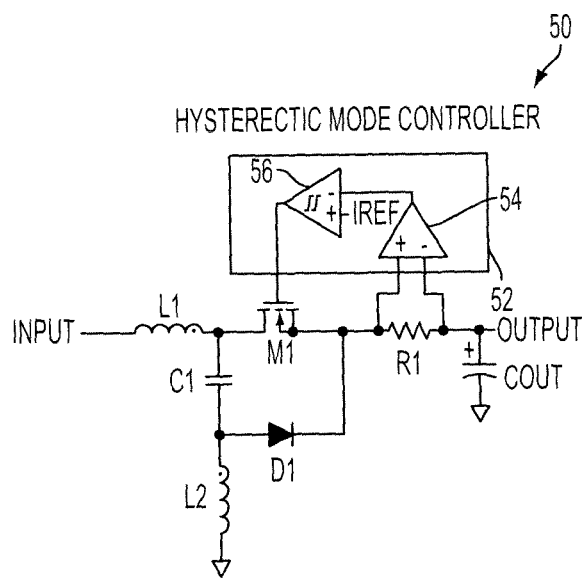
FIG. 7 illustrates an exemplary hysteretic mode switching regulator with the topology of the present disclosure.

FIG. 7 illustrates an exemplary switching regulator 50 with a controller 52 operating in a hysteretic mode. The controller 52 includes an operational amplifier 54 that monitors a voltage drop across the sense resistor R1 representing the current flowing through the resistor R1. A hysteresis comparator 56 compares the output signal of the operational amplifier 54 with a signal representing a reference current value Iref to produce an output signal that controls switching of the switch M1.

Figure 8:
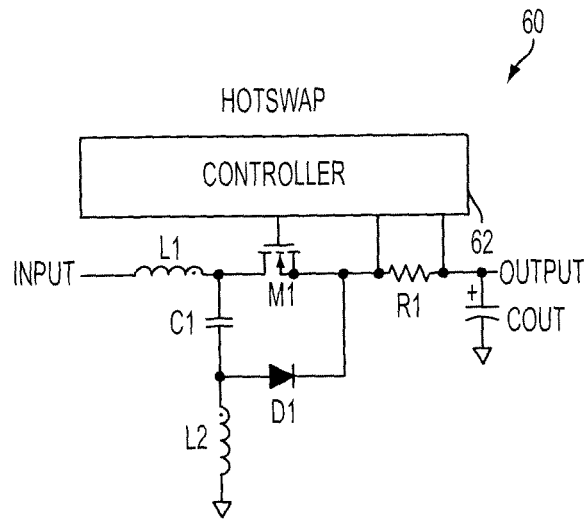
FIG. 8 illustrates an exemplary hot swap circuit with the topology of the present disclosure.

FIG. 8 illustrates an exemplary embodiment of a hotswap circuit 60 having the switching topology of the present disclosure. A hotswap circuit controls the increase in a load's voltage as the load is supplied with the input voltage. This keeps voltage and current changes under control, even if this input voltage changes suddenly, for example, when a circuit is connected abruptly to a live power supply. Traditional hotswap circuits have a large MOSFET transistor operating in a similar manner as a linear regulator with an output voltage that increases in a controlled manner. This controls dv/dt but the transistor spends significant time carrying current with a voltage drop present from drain to source, which dissipates power and causes thermal stress on the MOSFET. This stress requires that an appropriate MOSFET be chosen with an appropriate heat sink.

FIG. 8 shows the switching topology of FIG. 1 configured as a hotswap circuit 60. An input voltage is applied at the input node, and the load is attached to the output node. The hotswap circuit 60 includes a controller 62 that adjusts the duty cycle of the MOSFET M1 as the output voltage rises and as a function of time.

Before a typical hotswap event is started, M1 is off, the voltage at the output node is zero, and there are no currents flowing in the inductive elements L1 or L2. M1 is initially turned on by the controller 62 at a low duty cycle. When M1 turns on, current flows through the inductive element L1 and the transistor M1 to the sense resistor R1, and then to the output capacitor Cout and the load at the output node. Due to the inductance of L1, the current ramps from zero to a value controlled by L1, the input voltage, and the time that M1 is on.

When the transistor M1 is turned off, current suddenly stops flowing in M1 and the residual energy stored in the inductive element L1 causes the voltage at the drain of M1 to rise rapidly. The capacitive element C1 causes the anode of the diode D1 to rise as well, and when the anode voltage of D1 exceeds the cathode voltage of the diode D1 (which equals approximately to the voltage at the output node), the diode D1 will begin to conduct current. This current will flow through L1 and C1, then through D1 to the sense resistor R1 and the load. If L1 and L2 are coupled inductors with the phase shown in FIG. 8, some of the current in L1 will be converted to current in L2 and will flow from L2 to D1 and again to R1 and the load.

If L1 and L2 are independent inductors, some portion of the current in L1 will flow into L2 instead of D1 initially. After several cycles have occurred, this will cause the voltage on the capacitive element C1 to increase, and the polarity of the current in L2 will reverse and the behavior will become like in the coupled inductor case.

As the duty cycle of M1 is increased, the current in L1 will increase and the voltage at the OUTPUT node will increase in a controlled manner. As the duty cycle of M1 approaches 100% (i.e. the transistor M1 is continuously on), the voltage at the output node will approach the voltage at the input node, the current in L1 will approach the load current, and the hotswap cycle completes.

The hotswap circuit 60 of the present disclosure has an advantage over conventional linear hotswap circuits in that the MOSFET M1 operates only as a switch and never sees voltage from drain to source at the same time that it is carrying current. This means that MOSFETs with low on-resistances RDS(on), including those with limited safe operating areas (SOA), can be used as the transistor M1. It also minimizes power dissipation in M1, minimizing the need for heatsinking.

Another advantage of the hotswap circuit 60 is that currents at both the input and output nodes are smooth and continuous in a similar manner to a linear hotswap circuit, minimizing the need for input or output filtering.

Figure 9:
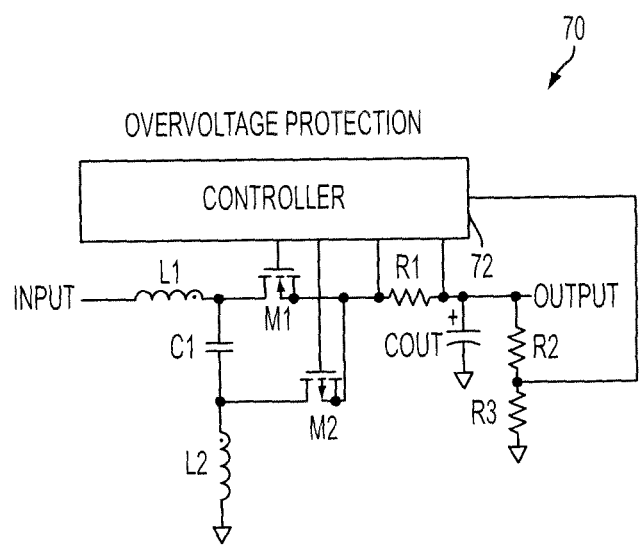
FIG. 9 illustrates an exemplary overvoltage protection circuit with the topology of the present disclosure.

FIG. 9 shows an exemplary overvoltage protection circuit 70 based on the switching topology in FIG. 1. The overvoltage protection circuit 70 is configured for protecting a load coupled to the output node from voltage spikes at the input node. The overvoltage protection circuit 70 includes a controller 70 and operates in a manner similar to the operation of the hot swap circuit 60 in FIG. 8. However, the overvoltage protection circuit 70 also includes a resistor divider composed of resistors R2 and R3 to measure the voltage at the output node, and a feedback loop that supplies the measured output voltage to the controller 72. Also, instead of the diode D1, the circuit 70 includes a MOSFET M2.

The duty cycle of the transistor M1 is controlled by the controller 72 to a value below 100% when a preset level of the output voltage is reached. This duty cycle control causes the overvoltage protection circuit 70 to act as a buck voltage regulator, where the output node is kept at a constant voltage even as the voltage at the input node rises above the voltage at the output node. This behavior makes it possible to operate the overvoltage protection circuit 70 as a buck voltage regulator that reduces the input voltage to a desired output level if the preset output voltage is set below the expected input voltage.

Alternatively, the overvoltage protection circuit 70 may operate as a surge stopper if the preset output voltage is set higher than the usual steady-state input voltage but lower than expected peak voltages at the input node, i.e. input voltage spikes. When the overvoltage protection circuit 70 operates as a surge stopper, and a surge arrives at the input node, the controller 72 will adjust the duty cycle of transistor M1 from 100% operation in steady state to a lower duty cycle during the surge to keep the output voltage at or below the preset value. Also, the controller 72 controls the transistor M2 to turn this transistor on when the transistor M1 is off, and to turn M2 off when M1 is on.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A circuit for providing connection between a first node at a first voltage and a second node at a second voltage, comprising:
   a first inductive element having a first terminal coupled to the first node,
   a first switching element coupled between a second terminal of the first inductive element and the second node,
   a second inductive element having a first terminal configured for receiving current from the second terminal of the first inductive element, and having a second terminal coupled to a third node, and
   a second switching element coupled between the first terminal of the second inductive element and the second node,
   the first switching element being configured for providing a first path for a current flow between the first node and the second node when the first switching element is turned on, and the second switching element is turned off, and
   the second switching element being configured for providing a second path for a current flow between the first node and the second node when the second switching element is turned on and the first switching element is turned off.

2. The circuit of claim 1 further comprising a capacitive element coupled between the second terminal of the first inductive element and the first terminal of the second inductive element.

3. The circuit of claim 2 further comprising a controller configured for controlling a duty cycle of the first switching element.

4. The circuit of claim 1, wherein one of the first and second switching elements includes a transistor, and the other switching element includes a diode configured to conduct current when the first switching element is turned off.

5. The circuit of claim 1, wherein the first switching element includes a first transistor, and the second switching element includes a second transistor.

6. The circuit of claim 1, wherein the first and second inductive elements are magnetically uncoupled.

7. The circuit of claim 1, wherein the first and second inductive elements are magnetically coupled.

8. The circuit of claim 1, further comprising a current sense resistor configured to determine the sum of currents flowing through the first and second inductive elements.

9. The circuit of claim 3, wherein the controller is configured to control switching of the first switching element to provide a voltage at the second node regulated with respect to a voltage at the first node.

10. The circuit of claim 3, wherein the controller is configured to control switching of the first switching element to provide a voltage at the second node at a desired level lower than a voltage at the first node.

11. The circuit of claim 3, further comprising a feedback loop for providing a controller with a value representing voltage at the second node.

12. The circuit of claim 3, further comprising a feedback loop for providing a controller with a value representing voltage at the second node, and a current sense resistor for enabling the controller to determine current at the second node.

13. The circuit of claim 3, wherein the controller is configured to operate in a fixed frequency mode.

14. The circuit of claim 3, wherein the controller is configured to operate in a hysteretic mode.

15. The circuit of claim 1 configured as a hot swap circuit for attaching a load to the second node to receive a voltage from the first node.

16. The circuit of claim 1 configured as an overvoltage protection circuit for protecting a load coupled to the second node from voltage spikes at the first node.

17. A method of providing connection between a first node at a first voltage and a second node at a second voltage, the method comprising:
   coupling a first inductive element and a second inductive element between the first node and a third node, a first terminal of the first inductive element being coupled to the first node, a first terminal of the second inductive element being configured for receiving current from a second terminal of the first inductive element, and a second terminal of the second inductive element being coupled to the third node,
   coupling a first switching element between the second node and the second terminal of the first inductive element,
   coupling a second switching element between the second node and the first terminal of the second inductive element,
   switching the first switching element and the second switching element to provide alternating first and second current flows through the first and second switching elements.

18. The method of claim 17, wherein a capacitive element is coupled between the second terminal of the first inductive element and the first terminal of the second inductive element.

19. The method of claim 17, wherein the second switching element is turned off, when the first switching element is turned on, and the second switching element is turned on, when the first switching element is turned off.

* * * * *

UNITED STATES PATENT AND TRADEMARK OFFICE
CERTIFICATE OF CORRECTION

PATENT NO.         : 8,963,617 B1                                    Page 1 of 1
APPLICATION NO.    : 14/033110
DATED              : February 24, 2015
INVENTOR(S)        : Sim et al.

It is certified that error appears in the above-identified patent and that said Letters Patent is hereby corrected as shown below:

Title Page, (72) Inventor(s) should read: Yong Kok Sim, Singapore (SG); David McLean Dwelley, Santa Barbara, CA (US)

Signed and Sealed this
Fourteenth Day of June, 2016

Michelle K. Lee
*Director of the United States Patent and Trademark Office*